Figure 1:
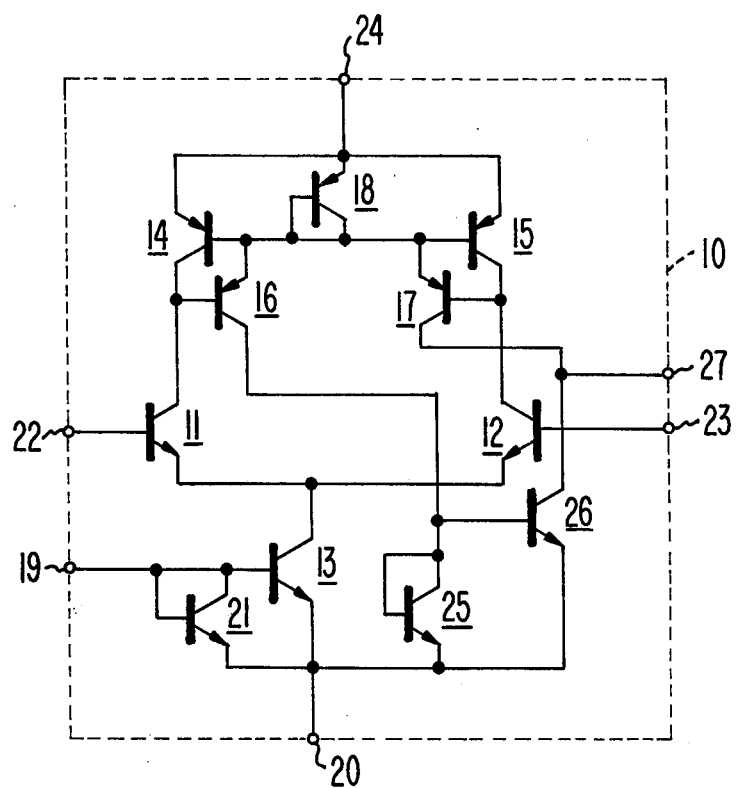

United States Patent [19]

Kaplan

[11] 3,995,235

[45] Nov. 30, 1976

[54] PHASE CONTROL CIRCUIT INCLUDING AN OPERATIONAL TRANSCONDUCTANCE AMPLIFIER SUITABLE FOR USE IN AUDIO FREQUENCY SIGNAL PROCESSING APPARATUS

[75] Inventor: Leonard Abraham Kaplan, Fords, N.J.

[73] Assignee: RCA Corporation, New York, N.Y.

[22] Filed: Oct. 24, 1975

[21] Appl. No.: 625,561

[52] U.S. Cl. .................................. 332/17; 84/1.25; 307/262; 328/155; 331/108 D; 331/143; 332/23 R
[51] Int. Cl.² ...................... G10H 1/04; H03C 3/00; H03C 5/00
[58] Field of Search .................. 332/16 R, 16 T, 17, 332/22, 23 R; 328/155; 307/262; 84/1.24, 1.25

[56] References Cited
UNITED STATES PATENTS

| | | | |
|---|---|---|---|
| 3,263,019 | 7/1966 | Hurvitz | 84/1.24 |
| 3,597,639 | 8/1971 | Harwood | 328/155 X |
| 3,719,782 | 3/1973 | Barnum | 84/1.24 X |
| 3,795,756 | 3/1974 | Suzuki | 84/1.25 X |

Primary Examiner—Siegfried H. Grimm
Attorney, Agent, or Firm—Eugene M. Whitacre; Ronald H. Kurdyla

[57] ABSTRACT

A phase control circuit includes an amplifier having a signal combining output, an inverting input signal supplied via a first coupling path with signals to be phase controlled, and a non-inverting input supplied via a second coupling path with such signals, the second coupling path including a reactive element and a variable admittance device. The variable admittance device comprises an operational transconductance amplifier exhibiting a controllable linear transconductance characteristic and an output admittance which varies proportionally to the transconductance in response to applied bias current. Variation of the bias current in a predetermined manner produces a corresponding variation in phase shift imparted to signals provided at the signal combining output.

13 Claims, 2 Drawing Figures

PHASE CONTROL CIRCUIT INCLUDING AN OPERATIONAL TRANSCONDUCTANCE AMPLIFIER SUITABLE FOR USE IN AUDIO FREQUENCY SIGNAL PROCESSING APPARATUS

This invention concerns phase control circuits and, more particularly, electrically variable phase control circuits providing substantially linear operation.

In many electrical signal processing applications, it is desirable to vary the phase of a signal in a precise manner with respect to control signals representative of a desired signal phase without undesirably varying signal amplitude. For example, electrically variable phase control circuits are commonly used in audio frequency signal processing applications to alter the character of a signal to enhance its tone or to create an aural impression of increased ambience or spaciousness for a listener. These and other audible effects may be accomplished by electrically varying the signal phase at a preselected rate of variation.

Electrically variable resistance-capacitance (R-C) phase control circuits may employ semiconductor devices (e.g., transistors) exhibiting a controllable output admittance (i.e., reciprocal impedance) as the resistive element of a phase shift network. The phase response of such arrangements is determined by the admittance of the semiconductor device. However, such devices typically exhibit a non-linear output admittance characteristic, or a relatively linear output admittance characteristic over a restricted operating range, thereby making it difficult to predict the resultant phase shift. Also, when several phase control stages are connected in cascade, the devices employed for each stage may be required to be individually selected for matched operating characteristics.

One type of electrically variable phase control circuit includes an operational amplifier with an inverting input coupled to a source of signals to be phase controlled, and a non-inverting input also coupled to the signal source via a reactive phase shift network including a capacitance. The capacitance cooperates with a variable admittance in the form of the drain-source current path of a field effect transistor, which comprises the resistive element of the phase shift network. Signals coupled via the two inputs are combined within the amplifier. The resultant output signal phase is determined by the magnitude of the output admittance of the transistor as controlled by a suitable source of external control signals. This circuit undesirably exhibits a non-linear control admittance characteristic attributable to the operating characteristics of the transistor device.

In certain applications, it is desirable to provide an electrically variable phase control circuit which provides a substantially linear conductance response as well as predictability of unit-to-unit performance.

Phase control apparatus in accordance with the present invention comprises a signal translating stage having inverting and non-inverting inputs and a combining output. Signals to be phase controlled are supplied to the inverting input via a first coupling path and to the non-inverting input via a second coupling path which includes a reactive element. An active current conducting device responsive to applied bias current for exhibiting a controllable linear transconductance and proportionally related output admittance has an output coupled to an input and to the reactive element, and a control input for receiving such bias current. A predetermined transconductance and output admittance of the device and a resultant predetermined phase of signals at the output of the signal translating stage relative to the phase of the input signals are thereby realized.

Figure 2:
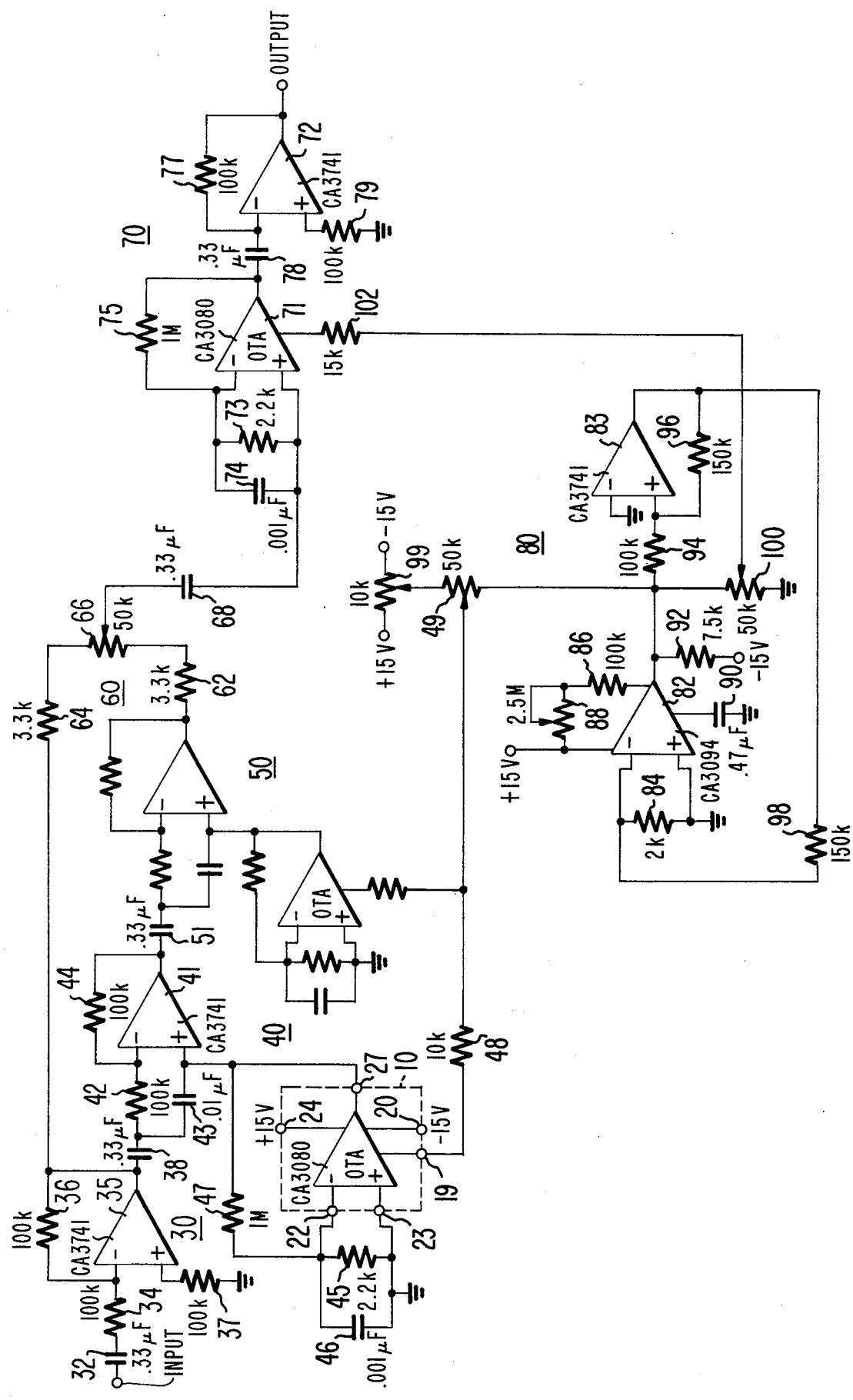

For a detailed explanation, reference is made to the following specification and accompanying drawings, in which:

FIG. 1 is a schematic diagram of a suitable operational transconductance amplifier used in the practice of the invention; and FIG. 2 is a schematic circuit diagram of apparatus incorporating a phase control circuit embodying the invention.

FIG. 1 depicts an operational transconductance amplifier (OTA) 10. The OTA 10 is of the type described in U.S. Pat. No. 3,614,645 issued Oct. 19, 1971 to Carl Franklin Wheatley, Jr. and assigned to RCA Corporation. More detailed information concerning OTA 10 may be found in RCA Technical Bulletin No. 475 and in RCA Application Note ICAN-6668, each available from RCA Corporation, Somerville, New Jersey.

The OTA 10 is similar in some respects to a conventional operational amplifier in that the OTA includes a pair of differential input terminals 22, 23. The OTA 10, however, further includes a control terminal 19 for receiving external bias current to determine the conductivity level and thereby the transconductance ($g_m$) of the amplifier. This transconductance is substantially linear over a wide range of bias current and is directly proportional to the bias current level. The output admittance of the OTA 10, which is proportional to the transconductance of the OTA and to the applied bias current, therefore varies in a substantially linear manner as a function of applied bias current.

When integrated, an OTA of the type shown typically exhibits only relatively small unit-to-unit operating admittance variations (e.g., as compared to other semiconductor devices such as field effect transistors). Also, since the transconductance and corresponding output admittance of OTA 10 each are a function of externally applied bias current, minor variations in the typical transconductance parameter of an individual unit can be readily compensated for by tailoring the bias current.

FIG. 2 illustrates an audio frequency signal processing arrangement including phase control stages which employ an OTA as an electronically controllable admittance for determining signal phase. The arrangement shown in FIG. 2 includes an input buffer stage 30, a pair of phase control stages 40 and 50, a mixing network 60, an amplitude modulation stage 70, and a source of bias control signal 80.

Audio frequency input signals are coupled by a direct current (DC) blocking capacitor 32 and a resistor 34 to the inverting input of a unity voltage gain amplifier 35 of buffer stage 30. A feedback resistor 36 is connected between the output and inverting input of amplifier 35. A non-inverting input of amplifier 35 is returned to a point of reference potential (ground) via a drift stabilization resistor 37.

The output of amplifier 35 is coupled by a capacitor 38 to a phase control stage 40 comprising a unity voltage gain amplifier 41 and an operational transconductance amplifier 10 of the type shown in FIG. 1. Signals are supplied to inverting and non-inverting inputs of amplifier 41 via a resistor 42 and a capacitor 43, respectively. A gain determining feedback resistor 44 is connected between the output and inverting input of amplifier 41.

The OTA has inverting and non-inverting inputs, respectively designated as terminals 22 and 23, shunted by the parallel combination of a resistor 45 and a capacitor 46 which serves to inhibit amplifier oscillation. A feedback resistor 47 couples an output terminal 27 of OTA 10 to the inverting input at terminal 22. Feedback resistor 47 provides an added degree of admittance control for OTA 10 and forms a voltage divider with resistor 45 to maintain OTA 10 in substantially linear operation for signals which are developed across input terminals 22 and 23. Operating supply terminals 20 and 24 are respectively coupled to +15 volt and −15 volt sources of operating potential. A resistor 48 is coupled between a bias current input terminal 19 of OTA 10 and the wiper arm of a bias adjustment potentiometer 49.

In the case of an OTA of the commercial type CA3080 marketed by RCA Corporation, Somerville, New Jersey, terminals 19, 20, 22, 23, 24 and 27 of illustrated OTA 10 respectively correspond to terminals 5, 4, 2, 3, 7 and 6 of the commercially available CA3080 unit.

The output terminal 27 of OTA 10 is directly connected to the non-inverting input of amplifier 41 to form a controllable phase shift network with capacitor 43.

Output signals from phase control stage 40 are coupled by a capacitor 51 to a second phase control stage 50, which is arranged identical to phase control stage 40 in this example. The elements forming phase control stage 50 perform the same functions as the corresponding elements of previous phase control stage 40.

Output signals from amplifier 35 and phase control stage 50 are coupled to a mixing network 60 including isolation resistors 62 and 64 and a mixing potentiometer 66. Resistors 62 and 64 respectively couple the outputs of amplifier 35 and phase control stage 50 to either end of potentiometer 66. The wiper arm of potentiometer 66 is coupled by a capacitor 68 to a non-inverting input of an OTA 71 which, along with an output amplifier 72, forms an amplitude modulation stage 70.

The OTA 71 of amplitude modulation stage 70 has inverting and non-inverting inputs shunted by the parallel combination of a resistor 73 and a capacitor 74, and has an output coupled to the inverting input by a feedback resistor 75. Resistors 73 and 75 and capacitor 74 serve essentially the same functions as circuit elements 45, 47 and 46. Output amplifier 72 has an inverting input coupled to an output by a feedback resistor 77, and to the output of OTA 71 by a capacitor 78. A non-inverting input of amplifier 72 is returned to ground by a drift stabilizing resistor 79.

Bias control signal source 80 includes a pair of amplifiers 82 and 83 arranged to provide a low frequency oscillatory ramp or triangular waveform. Amplifier 82 comprises an operational transconductance amplifier and has a non-inverting input directly connected to ground and an inverting input coupled to ground by a resistor 84. The frequency of the oscillatory ramp waveform (less than 10 Hertz in a typical case) is determined by the series combination of a resistor 86 and an adjustable resistor 88 in cooperation with a charging capacitor 90. Series resistors 86 and 88 are coupled between a bias control input terminal of amplifier 82 and a +15 volt source. A sink output terminal of amplifier 82 is also coupled to the +15 volt source. Capacitor 90 is connected between an external frequency compensation (or inhibit input) terminal and ground. The frequency of the waveform produced by stage 80 is established by adjusting resistor 88, which determines the level of bias control current for the OTA portion of amplifier 82 and the charging rate of capacitor 90.

The output of amplifier 82 is coupled by a pull-down bias resistor 92 to a −15 volt source, and by a resistor 94 to a non-inverting input of amplifier 83. Amplifier 83 has an inverting input connected to ground, and an output coupled to the non-inverting input by a feedback resistor 96 and to the inverting input of amplifier 82 by a feedback resistor 98.

In the case of an amplifier 82 of the commercial type CA3094 marketed by RCA Corporation, the sink output terminal corresponds to terminal 8, the frequency compensation (or inhibit input) terminal corresponds to terminal 1, and the bias control input terminal corresponds to terminal 5. Also, for the commercial unit, the inverting input, non-inverting input, and output respectively correspond to terminals 2, 3, and 6, while positive and negative operating supply voltages may be respectively applied to terminals 7 and 4 (not shown) as appropriate.

Bias current level control potentiometer 49 is connected between the output of amplifier 82 and the wiper arm of a center frequency control potentiometer 99, which is connected between +15 volt and −15 volt sources. A second bias current level control potentiometer 100 is connected between the output of amplifier 82 and ground. The wiper arm of potentiometer 100 is coupled to a bias current input of OTA 71 by a resistor 102, which functions in the manner of resistor 48.

In operation, audio frequency signals coupled via amplifier 30 to phase control stage 40 may be phase shifted over a range of up to 180° depending upon the admittance represented by OTA 10 in the phase shift circuit including capacitor 43. In general, when the admittance of OTA 10 is a maximum, the non-inverting input is near signal ground and the input signal is connected directly to the inverting input of amplifier 41. Amplifier 41 is then in a voltage inverter configuration which produces 180° phase shift at the output. As the admittance of OTA 10 is decreased, the operation of amplifier 41 approaches that of a voltage follower with zero degrees phase shift.

The phase shift ($\phi$) developed by phase control stage 40 may be defined mathematically by the expression $$\phi = 2 \tan^{-1} (2\pi f \frac{C}{G})$$

where $\tan^{-1}$ represents the mathematical function arc tangent, and where:
 $f$ = the input signal frequency,
 $G$ = the magnitude of the admittance of OTA 10,
 $C$ = the magnitude of capacitor 43.

Since the admittance ($G$) of OTA 10 varies linearly with its transconductance as determined by the level of bias current into terminal 19 of OTA 10, more predictable circuit phase response results. It will be appreciated from the above expression that, for a given value of the admittance ($G$) of OTA 10, variable phase shift is produced as a function of signal frequency ($f$), which ranges between about 125 Hertz and 5000 Hertz in a typical case. It is also noted that the magnitude of the voltage gain of stage 40 is determined by the ratio of feedback resistor 44 to input resistor 42. Therefore, there is substantially no amplitude modulation of the phase shifted signal as the bias current is varied.

The bias current supplied to terminal 19 of OTA 10 is controlled in accordance with the repetitive ramp or triangular waveform from stage 80 via potentiometer 49 and resistor 48. The peak-to-peak amplitude range of the waveform establishes the range of admittance variation of OTA 10 and hence the amount of phase modulation. In a practical embodiment of stage 40, the admittance of OTA 10 was observed to vary from about 1 micromho (as established by resistor 47) when OTA 10 was biased substantially at cut-off, to about 20 micromhos when OTA 10 was supplied with a bias current of about 1.1 milliamperes. The resulting phase modulation is repetitive at the frequency of the ramp waveform and produces a sum spatial effect of moving and multiple sound sources when the signal is audibly reproduced. Potentiometer 49 serves to adjust the amplitude of the ramp waveform and therefore the amount of phase modulation. Center frequency control potentiometer 99 provides additional bias current control and functions to adjust the circuit phase-versus-frequency response characteristic. Such an adjustment may be required to accommodate the signal frequency spectrum which is characteristic of a particular musical instrument, for example.

Phase control stage 50 is identical to previous stage 40 and is used to introduce additional signal phase shift as required. For example, each of stages 40 and 50 may introduce different amounts of phase shift totalling a desired sum amount, or each may introduce identical amounts of phase shift to produce a desired audible effect in the time domain. Additional phase control stages (not shown) may be used for similar purposes.

Original signal from the output of input buffer stage 30 and phase shifted signal from the output of phase control stage 50 are combined in potentiometer 66 of mixing network 60. Combining such signals serves to further enhance the spatial characteristics by creating signal cancellation and reinforcement effects within the signal frequency spectrum. Potentiometer 66 may be adjusted to select the original signal, the phase controlled signal, or a combination of both to produce a desired effect.

Amplitude modulation stage 70 provides additional means of enhancing the signal supplied to it from mixing network 60 by amplitude modulating the combined (phase controlled) signal in synchronism with the phase modulation introduced by the phase control stages to produce a tremolo effect. For this purpose, OTA 71 of stage 70 functions as a variable linear source admittance in response to the control signal also supplied to its bias current input from stage 80 via potentiometer 100 and resistor 102.

The OTA 71 provides the effect of a variable input impedance (admittance) for output amplifier 72. The gain and hence the degree of amplitude modulation provided by stage 70 is essentially determined by the ratio of feedback resistor 77 to the variable input impedance represented by OTA 71. The peak-to-peak amplitude range of the ramp waveform from stage 80 establishes the range of OTA 71 admittance variation and therefore the amount of amplitude modulation, which is repetitive at the frequency of the ramp waveform.

Phase and amplitude modulated signals provided at the output of amplifier 72 may be supplied to loudspeakers or a recording medium via appropriate circuitry (not shown).

Although the invention has been disclosed in terms of a particular circuit embodiment, it should be recognized that other arrangements may be devised by those skilled in the art without departing from the scope of the invention.

What is claimed is:
1. A phase control circuit comprising:
signal translating means having inverting and non-inverting inputs and a signal combining output;
first coupling means for supplying signals to be phase controlled to said inverting input;
second coupling means including reactive means for supplying said signals to said non-inverting input; and
active current conductive means responsive to applied bias current for exhibiting a controllable linear transconductance characteristic and proportionally related output admittance and having at least one input, an output coupled to said one input and to said reactive means, and a control input for receiving said bias current to establish a predetermined transconductance and output admittance and thereby the phase of signals at said combining output of said signal translating means relative to the phase of said input signals.

2. A circuit according to claim 1, wherein said active current conducting means comprises:
an operational transconductance amplifier having inverting and non-inverting inputs and an output;
first DC coupling means coupled between said output and said inverting input; and
second DC coupling means coupled between said inverting and non-inverting inputs.

3. A circuit according to claim 2, wherein said first DC coupling means exhibits a larger impedance than said second DC coupling means.

4. A circuit according to claim 2, wherein said operational transconductance amplifier comprises:
first and second emitter coupled transistors with respective base electrodes to be supplied with input signals;
a current source connected between the emitters of said first and second transistors and a first point to be supplied with an operating potential;
a third transistor with a collector coupled to the collector of said first transistor;
a fourth transistor with a collector coupled to the collector of said second transistor, a base coupled to the base of said third transistor, and an emitter coupled in common with the emitter of said third transistor to a second point to be supplied with an operating potential;
a fifth transistor with an emitter coupled to the base electrodes of said third and fourth transistors and a base coupled to the collector of said third transistor for maintaining the base-emitter voltage of said fifth transistor and the collector-base voltage of said third transistor substantially equal;
a sixth transistor with an emitter coupled to the base electrodes of said third and fourth transistors and a base coupled to the collector of said fourth transistor for maintaining the base-emitter voltage of said sixth transistor and the collector-base voltage of said fourth transistor substantially equal; and output circuit means coupled to the collector electrodes of said fifth and sixth transistors.

5. A circuit according to claim 4, wherein said current source comprises a diode-connected transistor and a current source transistor having proportionally related conduction characteristics and being of like conductivity type for providing to the joined emitters of said first and second transistors a current proportional to a control current supplied to said diode-connected transistor.

6. A circuit according to claim 4, wherein said output circuit means comprises:
a seventh transistor with a collector coupled to the collector of said sixth transistor, a base coupled to the collector of said fifth transistor, and an emitter coupled to said first point; and
an eighth transistor in diode-connected configuration with base and collector electrodes coupled in common to said base of said seventh transistor, and an emitter coupled to said emitter of said seventh transistor.

7. A circuit according to claim 6 and further comprising:
a ninth transistor in diode-connected configuration having base and collector electrodes connected in common to said base electrodes of said third and fourth transistors, and an emitter coupled to said second point, wherein the conduction characteristics of said third, fourth and ninth transistors are proportionally related.

8. A circuit according to claim 7, wherein said first, second, seventh and eighth transistors are of opposite type conductivity from said third, fourth, fifth, sixth and ninth transistors.

9. Audio frequency signal processing apparatus comprising:
a source of control signals;
phase modulation means to be supplied with input signals and responsive to said control signals, and including:
a. first amplifier means having inverting and non-inverting inputs and a signal combining output;
b. first coupling means for supplying said input signals to said inverting input;
c. second coupling means including reactive means for supplying said input signals to said non-inverting input; and d. second amplifier means responsive to applied bias current for exhibiting a controllable linear transconductance characteristic and proportionally related output admittance and having at least one input, an output coupled to said one input and to said reactive means, and a control input coupled to said source of control signals for receiving bias current corresponding to said control signals to establish a predetermined transconductance and output admittance and thereby the phase of signals at said combining output of said first amplifier means relative to the phase of said input signals;
signal combining means supplied with said input signals and output signals from said phase modulation means; and
amplitude modulation means supplied with combined signals from said combining means and responsive to said control signals for providing output signals being phase and amplitude modulated in synchronism as determined by said control signals.

10. Apparatus according to claim 9, wherein said second amplifier means comprises:
an operational transconductance amplifier having inverting and non-inverting inputs and an output;
a first resistance coupled between said output and said inverting input; and
a second resistance having a smaller value than said first resistance coupled between said inverting and non-inverting inputs.

11. Apparatus according to claim 10, wherein said control input of said second amplifier means is coupled to said source of control signals by an impedance for determining said bias current.

12. Apparatus according to claim 11, wherein said source of control signals coupled to said control input includes:
first bias control means for controlling the amplitude of said control signals; and
second bias control means for controlling the phase-versus-frequency response of said phase modulation means.

13. Apparatus according to claim 12, wherein said control signal source provides oscillatory signals.

* * * * *